US008782452B2

(12) United States Patent
Bacchus et al.

(10) Patent No.: US 8,782,452 B2
(45) Date of Patent: Jul. 15, 2014

(54) METHOD AND SYSTEM FOR POWER-EFFICIENT AND NON-SIGNAL-DEGRADING VOLTAGE REGULATION IN MEMORY SUBSYSTEMS

(75) Inventors: Reza M. Bacchus, Spring, TX (US); Vincent Nguyen, Houston, TX (US); Melvin K. Benedict, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 256 days.

(21) Appl. No.: 13/383,359

(22) PCT Filed: Jul. 27, 2009

(86) PCT No.: PCT/US2009/051875
§ 371 (c)(1),
(2), (4) Date: Jan. 10, 2012

(87) PCT Pub. No.: WO2011/014158
PCT Pub. Date: Feb. 3, 2011

(65) Prior Publication Data
US 2012/0110363 A1 May 3, 2012

(51) Int. Cl.
*G06F 1/00* (2006.01)
*G06F 1/26* (2006.01)
*G06F 1/32* (2006.01)
*G11C 5/14* (2006.01)
*G11C 5/04* (2006.01)

(52) U.S. Cl.
CPC ............... *G11C 5/04* (2013.01); *G06F 1/3225* (2013.01); *G11C 5/147* (2013.01)
USPC ........... 713/320; 713/300; 713/324; 365/226; 365/227

(58) Field of Classification Search
USPC ........................ 713/300, 320; 365/226, 227
See application file for complete search history.

(56) References Cited

U.S. PATENT DOCUMENTS

| | | | |
|---|---|---|---|
| 6,363,450 B1 * | 3/2002 | Lash et al. | 710/301 |
| 6,577,535 B2 | 6/2003 | Pasternak | |
| 6,665,736 B1 | 12/2003 | Fan | |
| 6,775,784 B1 * | 8/2004 | Park | 713/320 |
| 7,360,104 B2 * | 4/2008 | Harris et al. | 713/300 |
| 7,523,373 B2 * | 4/2009 | Russell et al. | 714/745 |
| 7,987,334 B2 * | 7/2011 | Wang | 711/170 |
| RE43,223 E * | 3/2012 | Stimak et al. | 365/222 |
| 8,205,107 B2 * | 6/2012 | Berke et al. | 713/340 |
| 2006/0174140 A1 * | 8/2006 | Harris et al. | 713/300 |
| 2006/0236134 A1 | 10/2006 | Kamepalli et al. | |

OTHER PUBLICATIONS

International Searching Authority, International Search Report and The Written Opinion, 10 pages Apr. 16, 2010.

* cited by examiner

*Primary Examiner* — Mark Connolly (57) ABSTRACT

Embodiments of the present invention are directed to a memory subsystem comprising a memory controller, multiple memory modules interconnected with the memory controller by one or more communications media, each memory module comprising a substrate to which multiple memory chips are mounted and electronically connected to the communications media, and a power-supply signal routed to two or more voltage regulators within the memory subsystem from a system power supply, the voltage regulators outputting two or more internal power signals, each power signal providing a different, regulated voltage, which are routed to each of the memory chips. Another embodiment of the present invention is directed to a memory module comprising a substrate to which multiple memory chips are mounted and two or more voltage regulators mounted to, or fabricated within, the substrate.

20 Claims, 10 Drawing Sheets

METHOD AND SYSTEM FOR POWER-EFFICIENT AND NON-SIGNAL-DEGRADING VOLTAGE REGULATION IN MEMORY SUBSYSTEMS

TECHNICAL FIELD

The present invention is related to computer systems and, in particular, to voltage regulation within memory subsystems of computer systems and other electronic devices.

BACKGROUND OF THE INVENTION

Socioeconomic and technological trends are driving designers of computer systems to reduce power consumption by computer systems and ameliorate problems related to heat dissipation within computer systems by reducing voltages supplied to components of computer systems. Increasing concern for the environmental consequences of power generation are driving consumer demand for "green" products in general, and energy-efficient electronic devices and appliances, in particular. Lower-voltage devices are often more cost effective to operate, over time, and may be less expensive to manufacture. The geometrically increasing densities and increasing operational frequencies of random-access memories and other computer components are creating ever increasing heat-dissipation problems for components of computer systems, mobile telephones, and other electronic device, often ameliorated, to some degree, by reducing voltages, output from power-supplies, at which the memories and other components operate.

Although use of lower voltages may decrease power consumption and heat generation, use of lower voltages may also have unintended effects of degrading signal integrity within components of electronic systems by reducing the magnitude of the voltage swings between binary OFF and ON signals and by increasing response times. Furthermore, the voltage requirements and voltage-reduction tolerances of various internal subcomponents of a component may significantly differ. A voltage reduction that produces no deleterious effects in certain voltage-reduction-tolerant subcomponents may seriously degrade the performance of, and increase the error rate in, another subcomponent. In addition, high-power components may, as a result of voltage reductions, draw greater currents, resulting in increased power dissipation through power-supplying signal lines. Many systems employ multiple, relatively inefficient linear voltage regulators, the efficiencies of which decrease as the voltage output by the voltage regulator decreases relative to the input voltage, to internally distribute power signals with various different voltages. Decreasing output voltages from these voltage regulators may decrease the power efficiency of the containing system or device. For these reasons, designers, manufacturers, and, ultimately, users of electronic systems continue to seek lower-power-consuming computer systems and other electronic systems and devices that lower power consumption without introducing signal degradation, power-distribution inefficiencies, and/or unreliable operation.

DETAILED DESCRIPTION OF THE INVENTION

Figure 1:
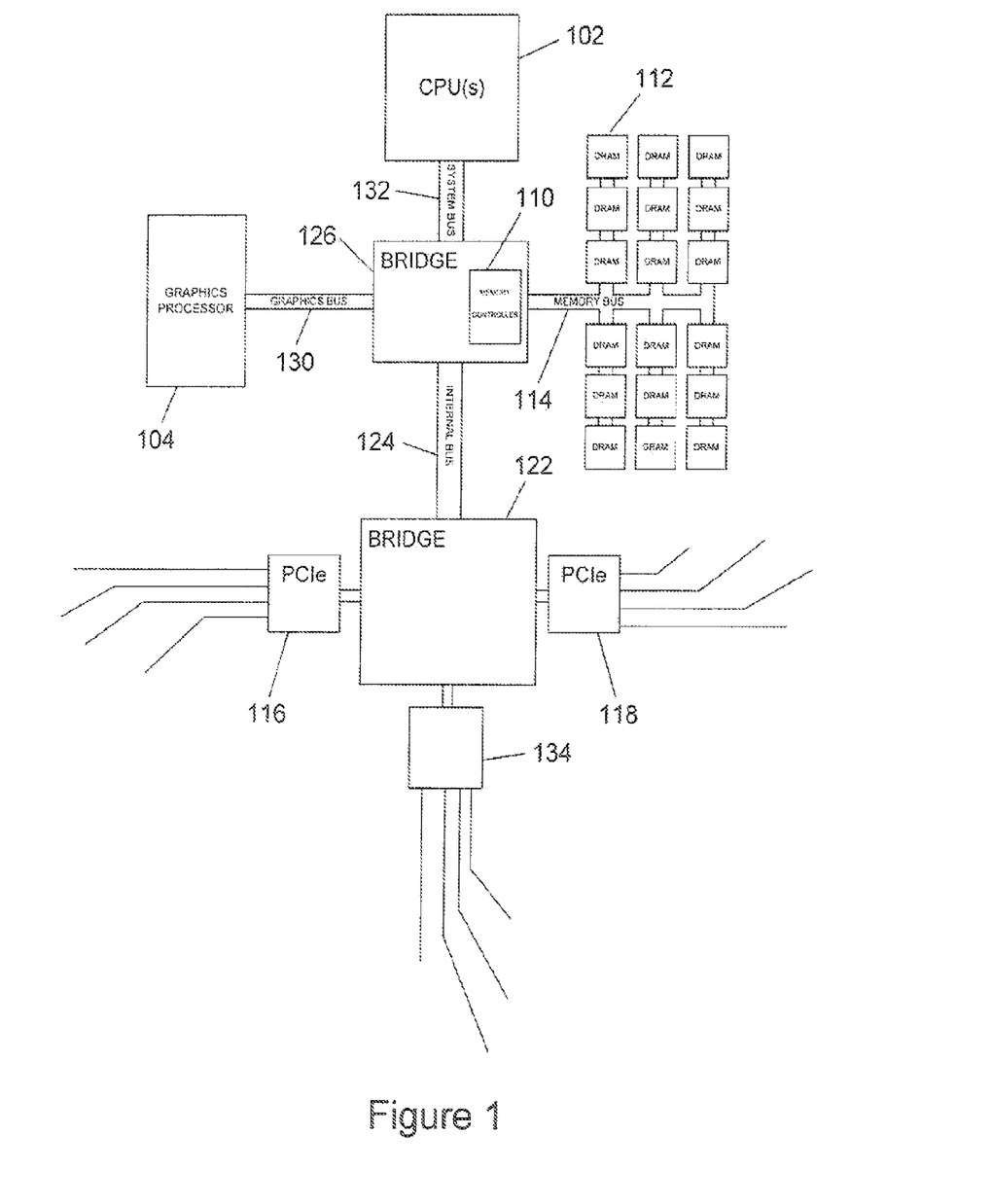
FIG. 1 provides a high-level block diagram that shows internal components of a computer system.

FIG. 1 provides a high-level block diagram that shows internal components of a computer system. The computer system illustrated in FIG. 1 is generic. Different types of computer systems feature different and often far more complex architectures. The generic computer system illustrated in FIG. 1 provides a reasonable context for the following discussion of memory subsystems and memory modules. The system includes one or more central-processing units ("CPUs") 102 which execute instructions and initiate data transfer within the computer system and a graphics processor 104 that controls display of information to a display device. A memory subsystem includes a memory controller 110 interconnected with a number of memory modules, such as memory module 112, through a high-speed memory bus. One or more serial-communications-media hubs 116 and 118 link high-speed serial interconnects to various peripheral devices (not shown in FIG. 1), including mass-storage devices, to a bridge 122 that is interconnected through an internal bus 124 to a second bridge 126. The second bridge 126 interconnects the one or more CPUs 102, graphics processor 104, memory subsystem, and the first bridge 124 to one another through the internal bus 124, the memory bus 114, a graphics bus 130, and a system bus 132. Addition I/O controllers 134 may be interconnected to the second bridge.

The memory subsystem provides temporary instruction and data storage for the one or more CPUs. The memory subsystem additionally acts as a buffer for storing data retrieved from relatively slow mass-storage devices for high-speed access by the one or more CPUs and the graphics processor. Instructions and data are fetched, by the one or more CPUs, from the memory subsystem into internal CPU registers for execution and use as operands for instruction execution, respectively. In general, information is stored in a hierarchy of data-storage components organized with respect to storage capacity and access speed, with the smallest-capacity components providing fastest access. CPU registers have a very small storage capacity, but provide the fastest possible access for instruction and data fetch by the one or more CPUs. Mass-storage devices provide immense storage capacities, but provide the slowest access and highest READ and WRITE latencies. Computer-system performance may be highly correlated with memory-subsystem capacity, data-transfer bandwidth, and READ and WRITE latencies.

In general, each successive generation of operating systems and application programs need greater amounts of memory for execution, which drives hardware designers and chip manufacturers to design and manufacture memory chips with ever-increasing memory densities. A personal computer in the 1980s generally provided less than one megabyte of internal memory-subsystem capacity, which was sufficient for executing the operating systems and application programs used at that time. Currently, low-cost personal computers commonly include memory subsystems with capacities of four gigabytes or greater. The memory subsystem is one of the largest consumers of electrical power within a computer system and, as a result, generates large amounts of heat. The ever-increasing density of memory-storage units within memory integrated circuits exacerbates the power-dissipation problems associated with memory. This, in turn, results in a desire to decrease voltages applied to memory subsystems in order to decrease power consumption and heat generation by memory subsystems.

Figure 2:
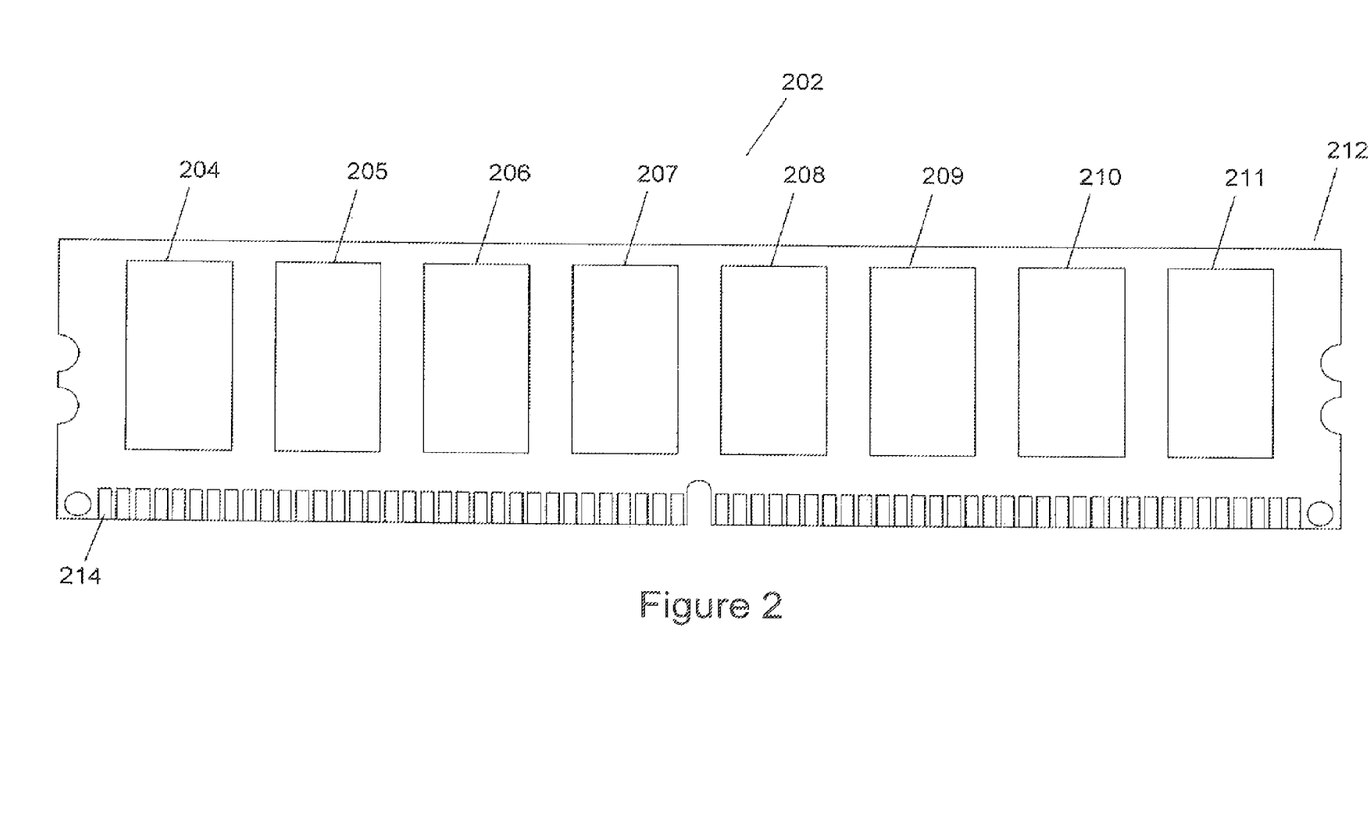
FIG. 2 illustrates a typical dual-in-line memory module ("DIMM").

FIG. 2 illustrates a typical dual-in-line memory module ("DIMM"). The DIMM 202 includes a number of dynamic-random-access-memory ("DRAM") integrated circuits, or chips, 204-211 affixed to a rectangular substrate 212 having a relatively high aspect ratio. The DRAM chips are electrically interconnected by traces with a large number of conductive pins, such as pin 214, that interconnect the DRAMs with a DIMM socket that, in turn, is electrically interconnected with data and control/address busses when the DIMM is mounted to a DIMM socket mounted to a printed-circuit board.

Figure 3:
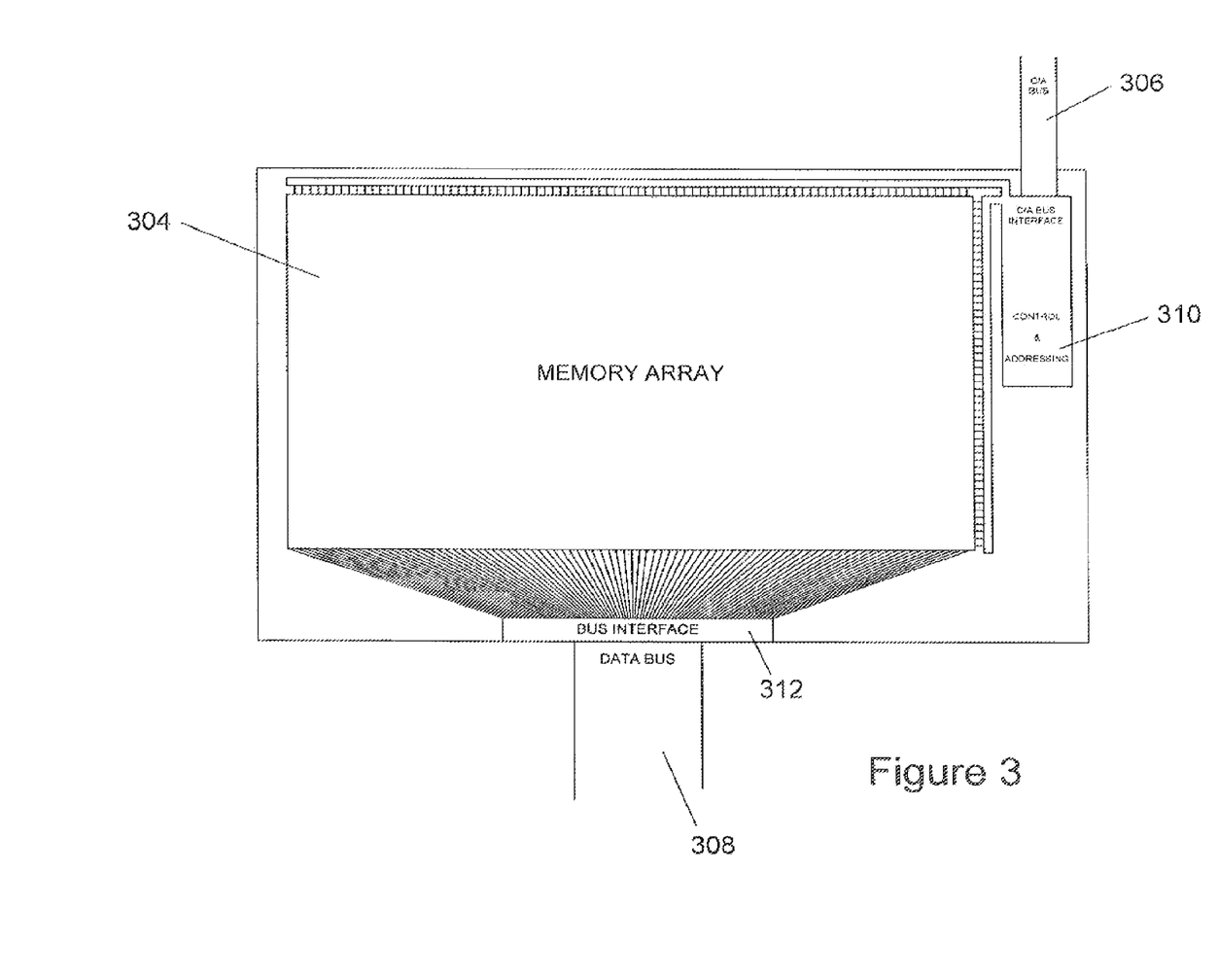
FIG. 3 provides a functional block diagram of a DRAM chip.

FIG. 3 provides a functional block diagram of a DRAM chip. It should be noted that FIG. 3 is not intended to show actual dimensions, relative dimensions, or positions of physical subcomponents within a DRAM chip, but is instead intended simply to illustrate basic functional blocks included in a DRAM chip. The largest subcomponent of a DRAM chips a two-dimensional array 304 of memory-storage units, or cells. Each memory-storage cell can store one bit of information, generally using a transistor to gate electrical access to a capacitor that stores the bit as stored charge. Because the capacitor quickly leaks charge, DRAM chips need to be electronically refreshed at millisecond or submillisecond intervals. The DRAM chip is interconnected with a command-and-address bus 306 and a data bus 308. The command-and-address bus ("C/A bus") receives commands and addresses that specify READ and WRITE operations from the memory controller, which are used by a control and addressing module 310 within the DRAM chip to select rows, or subsets of rows, of memory cells for either READ or WRITE access. For READ access, the contents of a row, or subset of a row, are driven through a bus interface 312 to the data bus 308. For WRITE access, a portion of a word of memory is driven from the data bus to a row, or portion of a row, of memory elements within the two-dimensional memory array 304. A DRAM chip contains additional components, including refresh logic and a power-distribution subsystem, discussed below.

Figure 4:
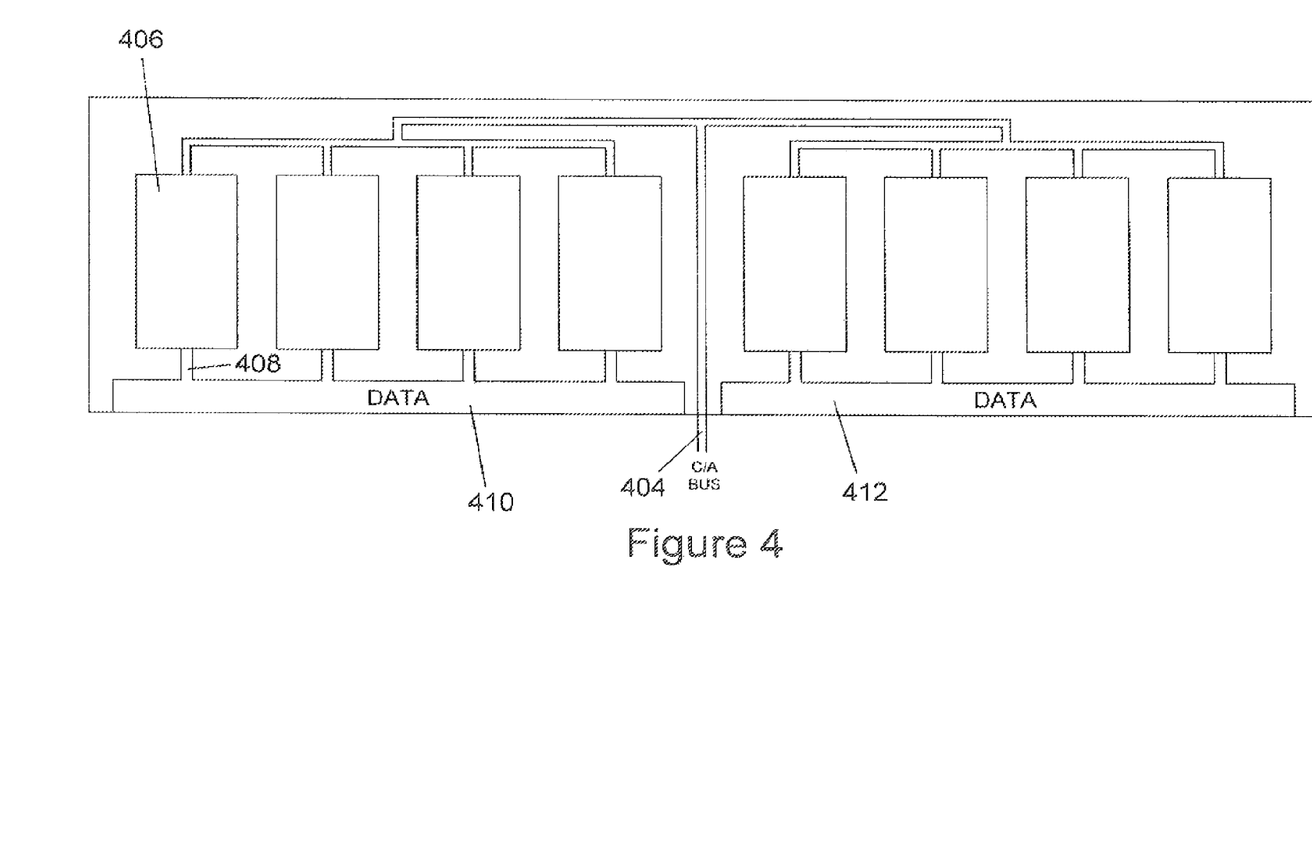
FIG. 4 illustrates control, address, and data paths within a DIMM.

FIG. 4 illustrates command, address, and data paths within a DIMM. As shown in FIG. 4, the C/A bus 404, for certain types of DIMMs, branches in tree-like fashion to interconnect each DRAM chip, such as DRAM chip 406, to the C/A bus with an equal number of branch points. The data bus of each DRAM chip, such as data bus 408, interconnects with the pins 410 and 412 through which the DIMM is connected to complementary conductive elements in a DIMM socket and, in turn, to the memory bus fabricated on a mother board.

Figure 5:
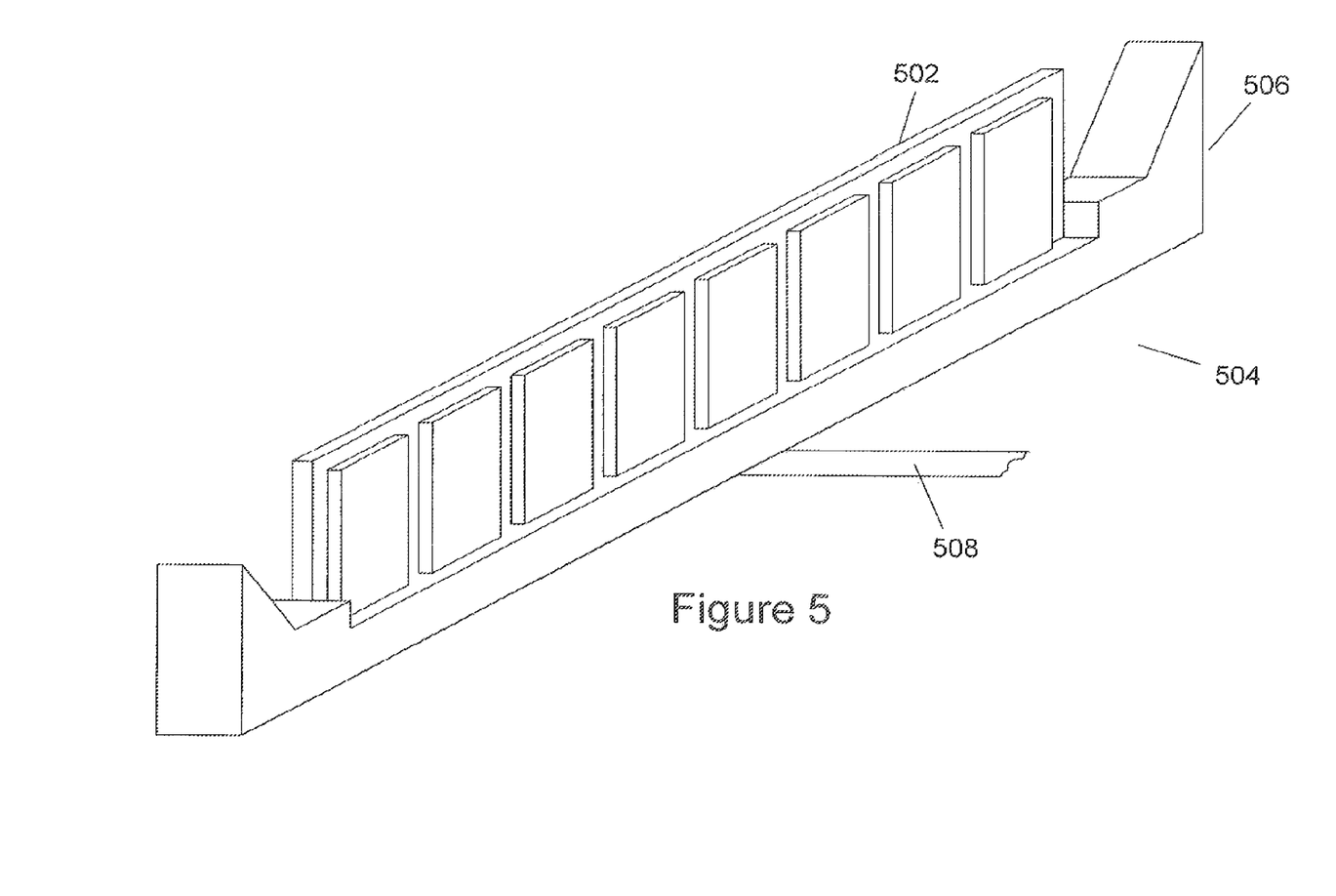
FIG. 5 illustrates a DIMM inserted into a DIMM socket mounted to a mother board.

FIG. 5 illustrates a DIMM inserted into a DIMM socket mounted to a mother board. The DIMM 502 is mounted approximately normal to the plane of the mother board 504, with the pins electrically connected within the DIMM receptacle 506 to the memory bus 508, fabricated on the mother board, that leads to the memory controller.

There are many different types of DIMMs, including various generations of DIMMs based on corresponding generations of DRAM chips, including double-data-rate DRAM chips DDR2 and DDR3. Various different types of DIMMs may employ various internal connection topologies, additional features, including registers, buffers, and control logic for accelerating memory-module access and increasing data-transfer rates. The specific details of the various types of DIMMs are generally outside of the scope of the current discussion.

Figure 6:
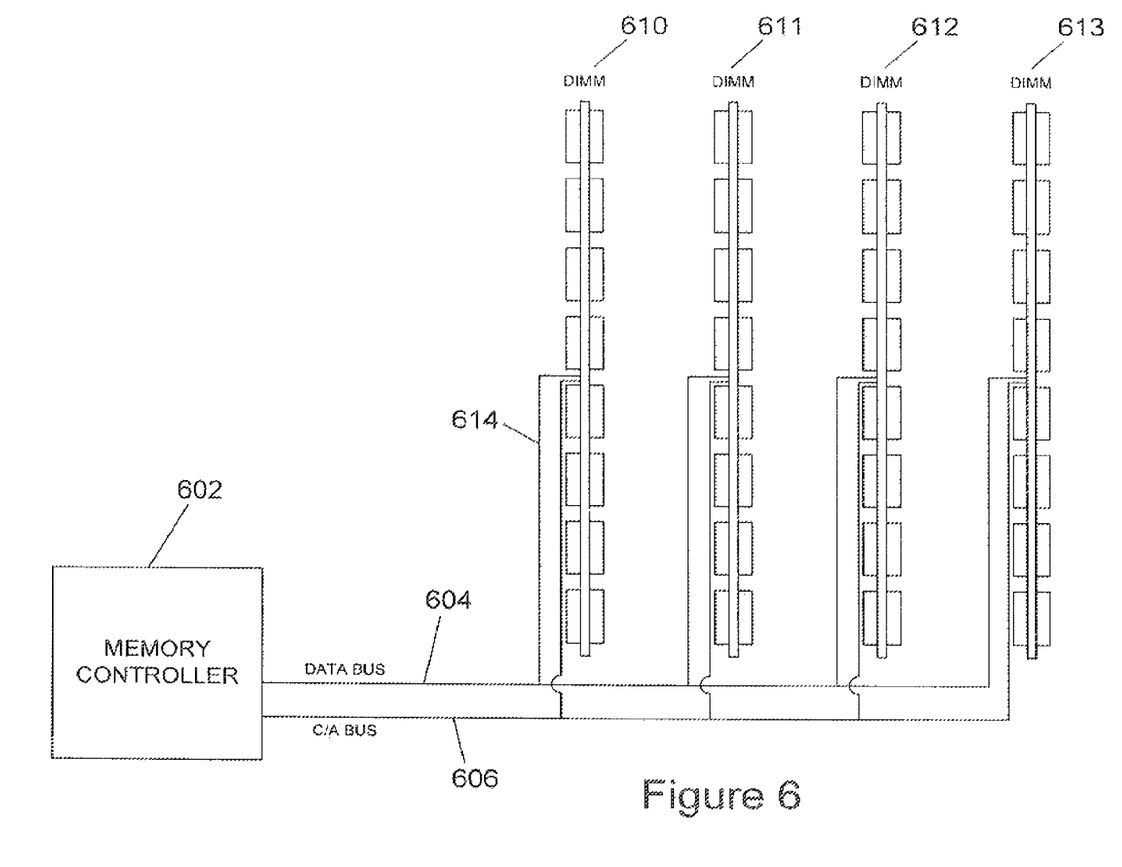
FIG. 6 illustrates one topology currently employed for memory subsystems.

FIG. 6 illustrates one connection topology currently employed for memory subsystems. In FIG. 6, the memory controller 602 is interconnected, through data-bus 604 and C/A-bus 606 components of the memory bus to four DIMMs 610-613. Note that, in FIG. 6, the DIMMs are double-sided, with DRAMs mounted to both sides of each DIMM. The connection topology illustrated in FIG. 6 is currently used in many personal computers and servers, but suffers certain disadvantages, including impedance discontinuities at the juncture of each stub bus, such as stub bus 614, that connects a DIMM to the memory bus, as well as a need for Serpentine, circuitous routing of signal lines to ensure that all signal lines between DIMM pins and the memory controller have approximately the same length.

Figure 7:
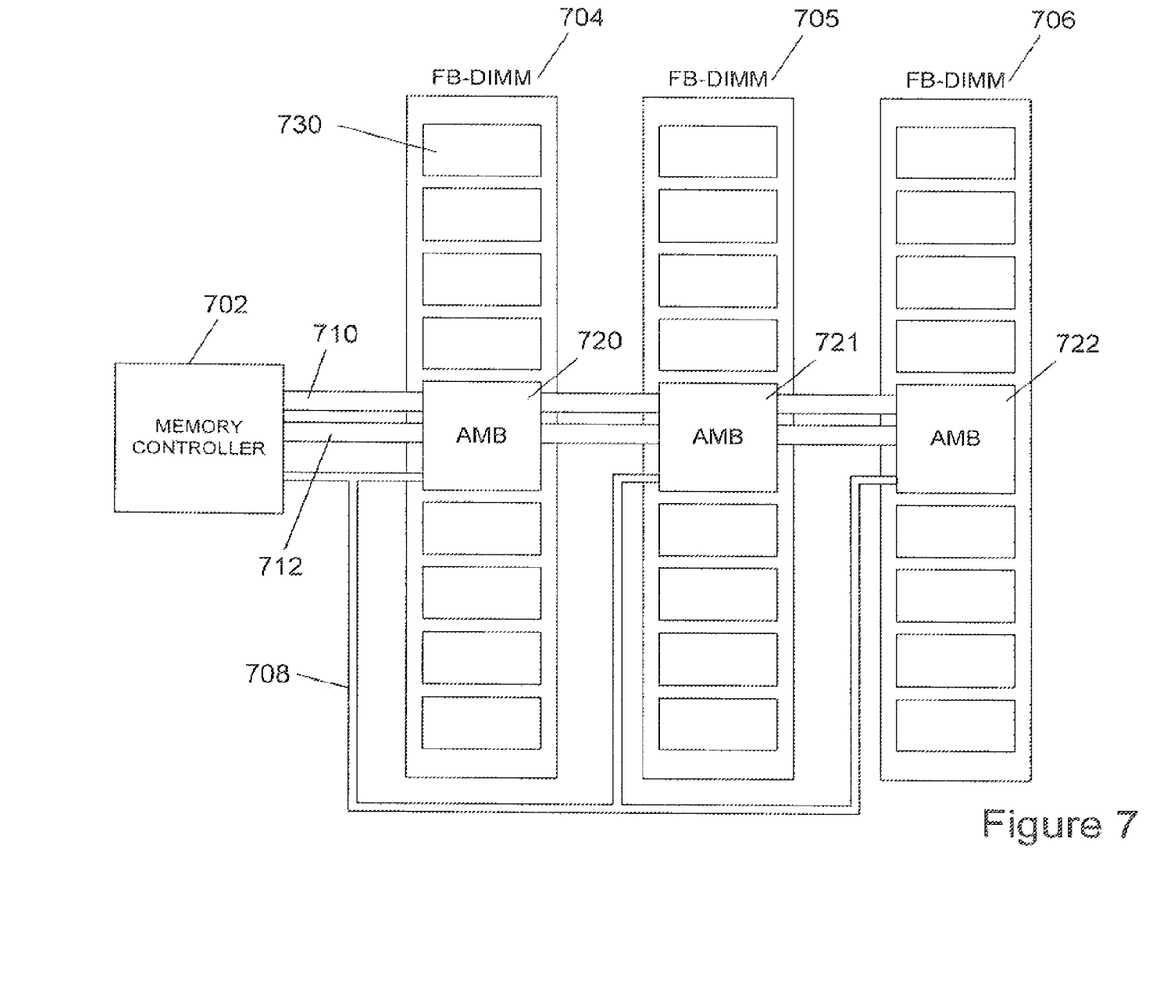
FIG. 7 illustrates a newer, serial-communications-medium-based memory-subsystem topology.

FIG. 7 illustrates a newer, serial-communications-medium-based memory-subsystem topology. In FIG. 7, the memory controller 702 is interconnected with each of three fully buffered DIMMs ("FB-DIMMs") 704-706 via a system-management bus ("SM bus") 708, a high-speed serial output communications medium 710 and a high-speed serial input communications medium 712. These high-speed serial communications media are similar to PCI express or SATA communications media. The high-speed serial communications media carry data, addresses, and commands, while the SM bus carries configuration information. The high-speed serial communications media and the SM bus are interconnected, on each FB-DIMM, with an advanced memory buffer ("AMB") chip 720-722 that manages serial-communications with the memory controller as well as data access to the DRAMs with the FB-DIMM, including DRAM 730 on FB-DIMM 704. The memory-subsystem topology shown in FIG. 7 is more power efficient and provides greater data-transfer bandwidth, but suffers from greater access latencies than the bus-based topology shown in FIG. 6.

Figure 8:
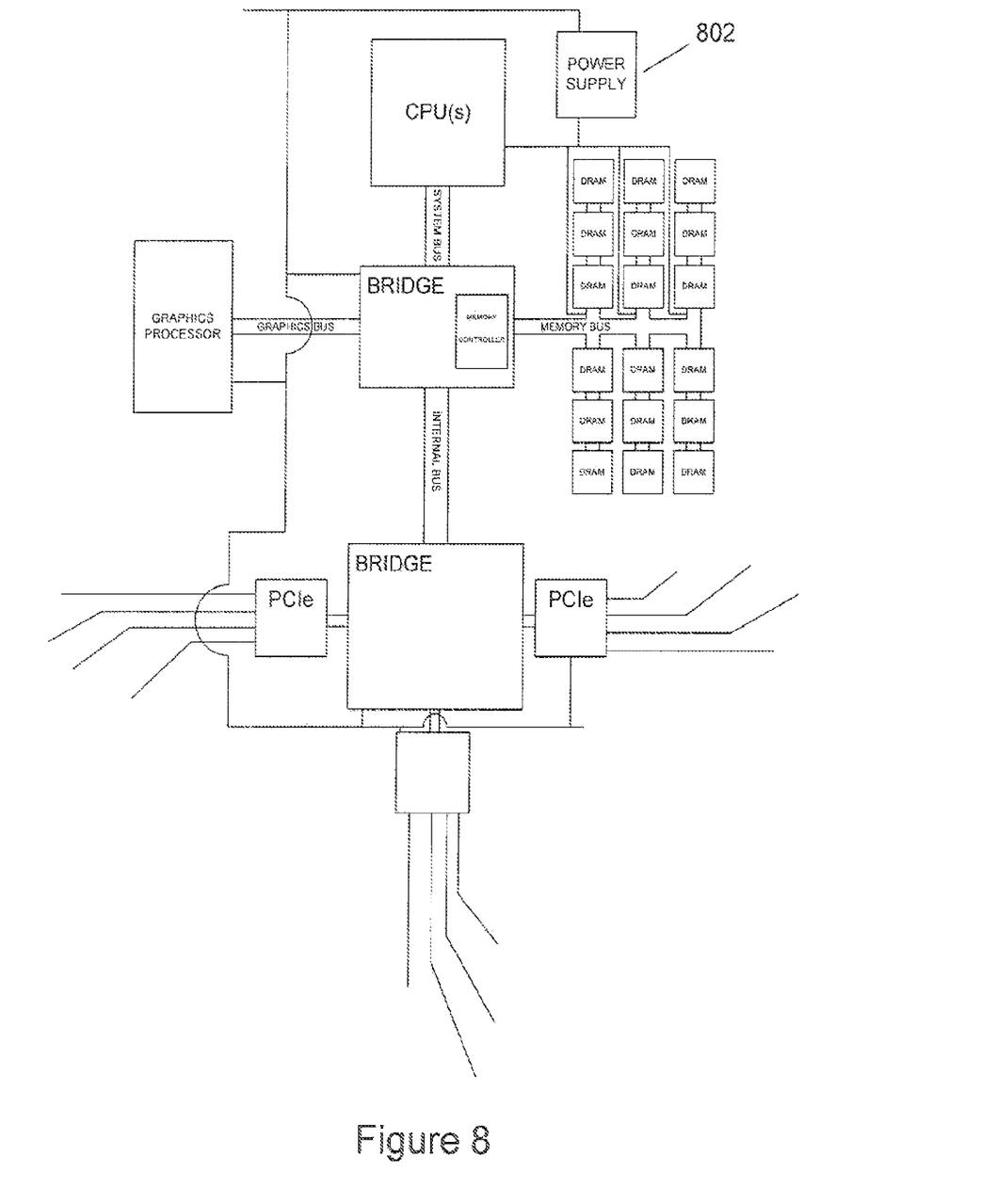
FIG. 8 illustrates power distribution within a computer system.

FIG. 8 illustrates power distribution within a computer system. FIG. 8 uses the same illustration conventions as FIG. 1. In FIG. 8, a power-supply component 802 has been added to the block diagram of the computer system. The power supply generally provides one or more different regulated direct-current ("DC") power signals with voltages between 0.5 volts and 12 volts to the component subsystems of the computer system. Some components and subsystems that require unique lower-voltage power sources employ internal voltage regulators to supply appropriate voltage levels to internal components.

Figure 9:
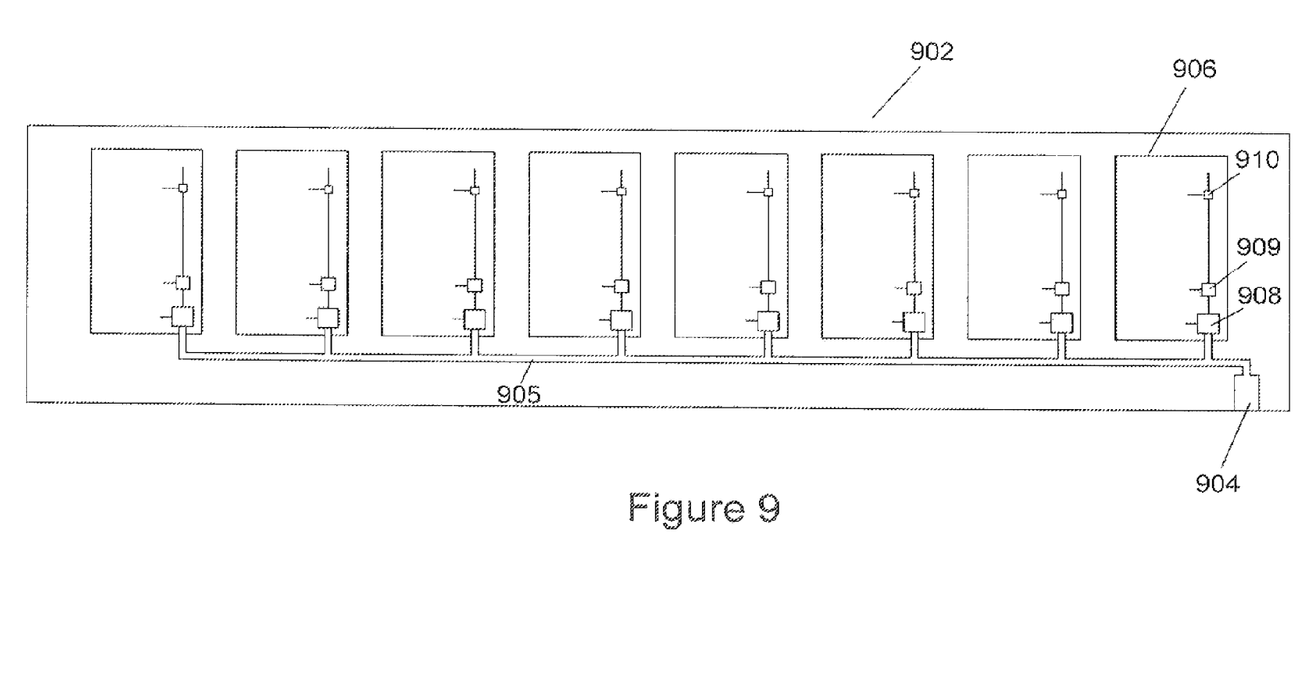
FIG. 9 illustrates power supply to DRAM chips within a DIMM.

FIG. 9 illustrates power supply to DRAM chips within a DIMM. The DIMM 902 receives system voltage through a power-supply pin 904. System voltage is then distributed to each DRAM by a DIMM power signal line 905. Within each DRAM chip, including DRAM chip 906, on-chip linear voltage regulators 908-910 furnish a variety of different, internal voltage outputs for powering subcomponents and subsystems of the DRAM chips. Linear voltage regulators are based on active devices, such as transistors, operating in their linear region of operation or passive devices, such as zener diodes, operating in their breakdown region. As a result, linear voltage regulators generally dissipate a large amount of power, and are relatively inefficient, with the inefficiency increasing at the ratio of load power, or output power, to input power decreases. Therefore, incorporating many voltage regulators, often ten or more, in each DRAM chip presents a significant source of power dissipation and inefficiency.

When, as discussed above, the system voltage is decreased, in order to lower power consumption and heat generation, each DRAM within a DIMM receives the lower-voltage power signal. Although the internal voltage regulators attempt to produce a constant voltage output, the voltage output of the internal voltage regulators generally decreases when the system voltage decreases, although at a lower rate. As a result, lower the system voltage by 50% may lower all internal voltages within the DRAM chips of memory modules by only 10% TO 20%. It may often be the case that, as a result, an insufficiently decreased internal power signal is supplied to voltage-reduction tolerant internal components, while the power signal supplied to certain voltage-reduction-intolerant components is too great.

As one example, referring to FIG. 3, the voltages applied to the two-dimensional memory array 304 may be relatively low, and may be readily decreased by decreasing the system voltage without deleteriously affecting DRAM operation. However, the bus interface 312, including data buffers, and the C/A bus interface 310, may suffer serious signal degradation and increase in error rates as a result of operating at even slightly lower voltages. Because the DRAMs receive only a single system voltage, as shown in FIG. 9, when system voltage is decreased, all of the internal voltages supplied by on-board voltage regulators correspondingly decrease, but the decrease may deleteriously affect bus interfaces and other higher-power-consuming internal components while, at the same time, the effective decrease in voltage to the memory-cell array is less than could be tolerated, and thus less than optimal decrease in power consumption and heat generation is effected. Thus, lowering of system voltage can often degrade memory-subsystem performance without providing as great an advantage in lower power consumption and heat generation as would be possible were lowering voltage to the memory cells the only consideration.

Figure 10:
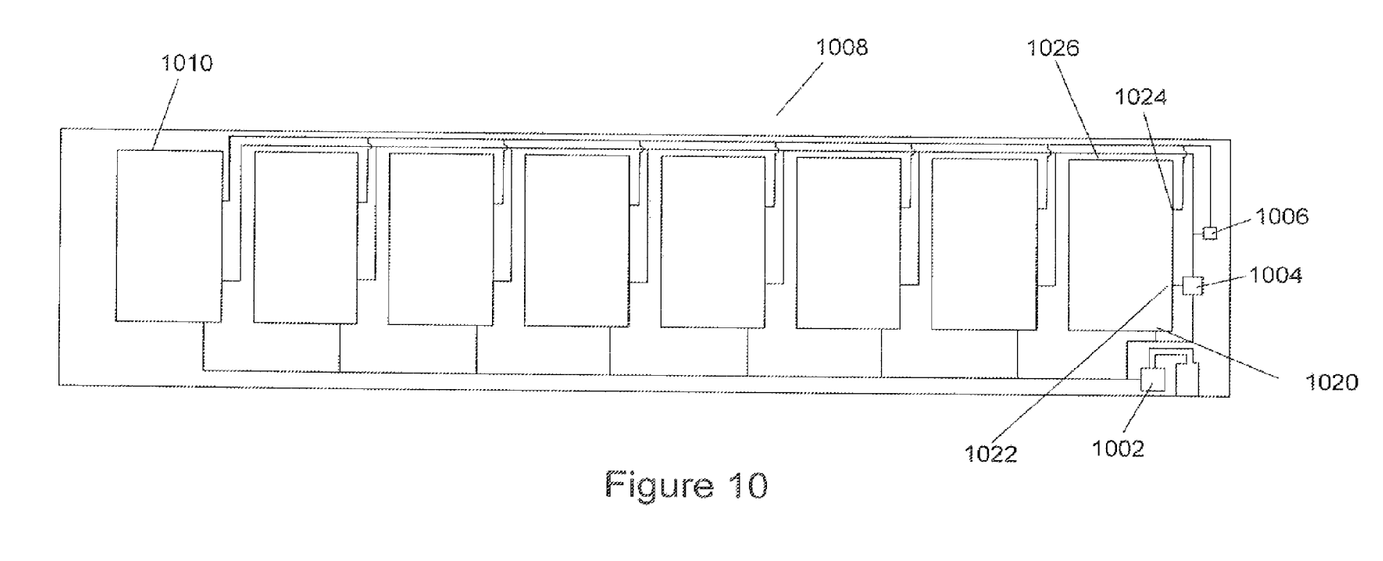
FIG. 10 illustrates one embodiment of the present invention.

In order to address the problems with current memory-chip voltage regulation, as discussed with reference to FIG. 9, embodiments of the present invention employ memory-module-based voltage regulation in addition to, or rather than, internal memory-chip voltage regulation. FIG. 10 illustrates one embodiment of the present invention. As shown in FIG. 10, voltage regulators 1002, 1004, and 1006 are mounted to, or fabricated on, the DIMM memory module 1008, rather than included as internal, on-chip voltage regulators within the DRAM chips, such as DRAM chip 1010. Signal lines, or traces, on the DIMM interconnect outputs of the memory-module-based voltage regulators 1002, 1004, and 1006 with different power-input pins on each DRAM, such as power-input pins 1020, 1022, and 1024 on DRAM chip 1026. As a result, voltage regulation is essentially moved from the DRAM chips to the DIMM. In the case that each DRAM includes ten on-board voltage regulators to supply ten different voltages to various components within the DRAM, a memory-module-based voltage-regulation system, according to the present invention, uses only ten voltage regulators mounted to the DIMM substrate to supply the 10 different voltages to each DRAM, rather than ten times the number of DRAM chips mounted to the DIMM. Certain currently-available DIMMs may include up to 72 DRAMs. In the case of a DIMM containing 72 DRAM chips, 720 voltage regulators are replaced with ten DIMM voltage regulators, according to one embodiment of the present invention. The memory-module-based voltage regulation of the present invention also allows the voltages supplied to the DRAM chips to be altered in order to accommodate decrease in system voltage. By using adjustable or replaceable voltage regulators on the memory module, relatively higher voltage can be supplied to bus interfaces and buffers by increasing the ratio of voltage output to voltage input for voltage regulators supplying power to those high-power subcomponents, while voltage supplied to lower-power components, including the two-dimensional memory array, can be decreased in accordance with the decrease in the system voltage.

To summarize, embodiments of the present invention decrease the number of voltage regulators used in memory subsystems, increasing power efficiency, while providing greater flexibility in supplying power at different regulated voltages to internal components of memory chips. As a result, signal integrity and timing constraints can be maintained, despite reductions in system voltage. In many cases, high-power components can be supplied with relatively high voltage power, avoiding the need to route high-current-carrying power-supply lines through a computer system.

Although the present invention has been described in terms of particular embodiments, it is not intended that the invention be limited to these embodiments. Modifications will be apparent to those skilled in the art. For example, memory modules may employ both on-chip voltage regulators as well as voltage regulators mounted to the DIMM substrate, in addition to the above-discussed embodiment in which memory-module voltage regulators replace on-chip voltage regulators. Any of various different types of voltage regulators can be employed as DIMM-mounted voltage regulators in various different numbers and configurations, in order to provide power signals of various regulated voltages needed by particular memory chips. In alternative embodiments of the present invention, voltage regulators may be provided separately from DIMMs, with power-supply signal lines from the separate voltage regulators routed through DIMM sockets and DIMMs to the DRAMs mounted to the DIMMs. Embodiments of the present invention can be applied to additional types of subsystems in electronic devices and computer systems, in addition to memory subsystems.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed, Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A memory subsystem comprising:
   a memory controller;
   one or more memory modules interconnected with the memory controller by one or more communications media, each memory module comprising a substrate to which multiple memory chips are mounted and electronically connected to the communications media; and
   a power-supply signal routed to two or more voltage regulators within the memory subsystem from a system power supply, the voltage regulators outputting two or more internal power signals, each power signal providing a different, regulated voltage, which are routed to each of the memory chips, wherein the voltage regulators are adjustable to enable voltage outputs to be adjusted independently from other memory-subsystem components.

2. The memory subsystem of claim 1 wherein the memory modules are dual-in-line memory modules interconnected with the memory controller by a memory bus.

3. The memory subsystem of claim 1 wherein the voltage regulators are replaceable.

4. The memory subsystem of claim 1 wherein the voltage regulators are mounted to each memory-module substrate, with output from the voltage regulators routed to power-input pins of each memory chip contained in each memory module.

5. The memory subsystem of claim 1 wherein the voltage regulators are included in a discrete voltage regulation component, with output from the voltage regulators routed through memory-module sockets to power-input pins of each memory chip contained in each memory module.

6. A computer system or other electronic device that contains the memory subsystem of claim 1 as a subcomponent and that includes a system power supply that outputs the power-supply signal routed to the two or more voltage regulators.

7. The memory subsystem of claim 1 wherein the memory modules are fully-buffered dual-in-line memory modules interconnected with the memory controller by serial input and output communications media and a system-management bus.

8. The memory subsystem of claim 1 wherein the memory modules are multiple memory chips mounted to a motherboard.

9. A memory module comprising:
multiple memory chips;
a substrate to which the multiple memory chips are mounted and electronically connected to one or more communications-media interfaces; and
a power-supply signal routed to two or more voltage regulators mounted to, or fabricated within, the substrate, the voltage regulators outputting two or more internal power signals, each power signal providing a different, regulated voltage, which are routed to each of the memory chips, wherein the voltage regulators are adjustable to enable voltage outputs to be adjusted independently from other memory-module components.

10. The memory module of claim 9 wherein the memory module is a dual-in-line memory module interconnected with a memory controller by a memory bus.

11. The memory module of claim 9 wherein the voltage regulators are replaceable.

12. A memory subsystem that contains the memory module of claim 9 as subcomponent.

13. A computer system or other electronic device that contains the memory subsystem of claim 12 as a subcomponent and that includes a system power supply that outputs the power-supply signal routed to the two or more voltage regulators.

14. A memory chip that accepts two or more different power signals through input power-signal pins from the voltage regulators of the memory module of claim 9.

15. The memory module of claim 9 wherein the memory module is a fully-buffered dual-in-line memory module interconnected with the memory controller by serial input and output communications media and a system-management bus.

16. A memory module comprising:
multiple memory chips;
a substrate to which the multiple memory chips are mounted and electronically connected to one or more communications-media interfaces; and
a power-supply signal routed to two or more voltage regulators mounted to, or fabricated within, the substrate, the voltage regulators outputting two or more internal power signals, each power signal providing a different, regulated voltage, which are routed to each of the memory chips,
wherein the multiple memory chips accept two or more different power signals through input power-signal pins from the voltage regulators.

17. A memory subsystem that contains the memory module of claim 16 as subcomponent.

18. A computer system or other electronic device that contains the memory subsystem of claim 17 as a subcomponent and that includes a system power supply that outputs the power-supply signal routed to the two or more voltage regulators.

19. The memory module of claim 16 wherein the memory module is a dual-in-line memory module interconnected with a memory controller by a memory bus.

20. The memory module of claim 16 wherein the memory module is a fully-buffered dual-in-line memory module interconnected with the memory controller by serial input and output communications media and a system-management bus.

* * * * *